(12) United States Patent
Dennard et al.

(10) Patent No.: US 8,236,661 B2
(45) Date of Patent: Aug. 7, 2012

(54) SELF-ALIGNED WELL IMPLANT FOR IMPROVING SHORT CHANNEL EFFECTS CONTROL, PARASITIC CAPACITANCE, AND JUNCTION LEAKAGE

(75) Inventors: Robert H. Dennard, Yorktown Heights, NY (US); Brian J. Greene, Hopewell Junction, NY (US); Zhibin Ren, Hopewell Junction, NY (US); Xinlin Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 12/568,287

(22) Filed: Sep. 28, 2009

(65) Prior Publication Data

US 2011/0073961 A1    Mar. 31, 2011

(51) Int. Cl.
*H01L 21/336* (2006.01)

(52) U.S. Cl. ........ 438/302; 438/369; 438/303; 438/306; 438/370; 438/299; 438/305; 257/408; 257/E21.435

(58) Field of Classification Search .................. 438/302, 438/369, 303, 306, 370, 299, 305; 257/408, 257/E21.435
See application file for complete search history.

(56) References Cited

U.S. PATENT DOCUMENTS

| | | | |
|---|---|---|---|
| 4,321,965 A | 3/1982 | Restarick et al. | |
| 4,599,789 A | 7/1986 | Gasner | |
| 4,906,585 A | 3/1990 | Neppl et al. | |
| 5,079,182 A | 1/1992 | Ilderem et al. | |
| 5,246,069 A | 9/1993 | Glaser et al. | |
| 5,466,960 A | 11/1995 | Ilderem et al. | |
| 5,550,074 A | 8/1996 | Lin | |
| 5,583,062 A | 12/1996 | Kapoor | |
| 5,705,840 A | 1/1998 | Shen et al. | |
| 6,399,987 B2 | 6/2002 | Kim | |
| 6,607,958 B2 * | 8/2003 | Suguro | 438/287 |
| 2004/0053457 A1 * | 3/2004 | Sohn | 438/197 |
| 2006/0022270 A1 * | 2/2006 | Boyd et al. | 257/351 |
| 2007/0128820 A1 * | 6/2007 | Majumdar et al. | 438/369 |
| 2009/0311834 A1 * | 12/2009 | Fenouillet-Beranger et al. | 438/151 |

* cited by examiner

*Primary Examiner* — Junghwa M Im
(74) *Attorney, Agent, or Firm* — Cantor Colburn LLP; Wenjie Li

(57) ABSTRACT

A method of forming a self-aligned well implant for a transistor includes forming a patterned gate structure over a substrate, including a gate conductor, a gate dielectric layer and sidewall spacers, the substrate including an undoped semiconductor layer beneath the gate dielectric layer and a doped semiconductor layer beneath the undoped semiconductor layer; removing portions of the undoped semiconductor layer and the doped semiconductor layer left unprotected by the patterned gate structure, wherein a remaining portion of the undoped semiconductor layer beneath the patterned gate structure defines a transistor channel and a remaining portion of the doped semiconductor layer beneath the patterned gate structure defines the self-aligned well implant; and growing a new semiconductor layer at locations corresponding to the removed portions of the undoped semiconductor layer and the doped semiconductor layer, the new semiconductor layer corresponding to source and drain regions of the transistor.

6 Claims, 15 Drawing Sheets

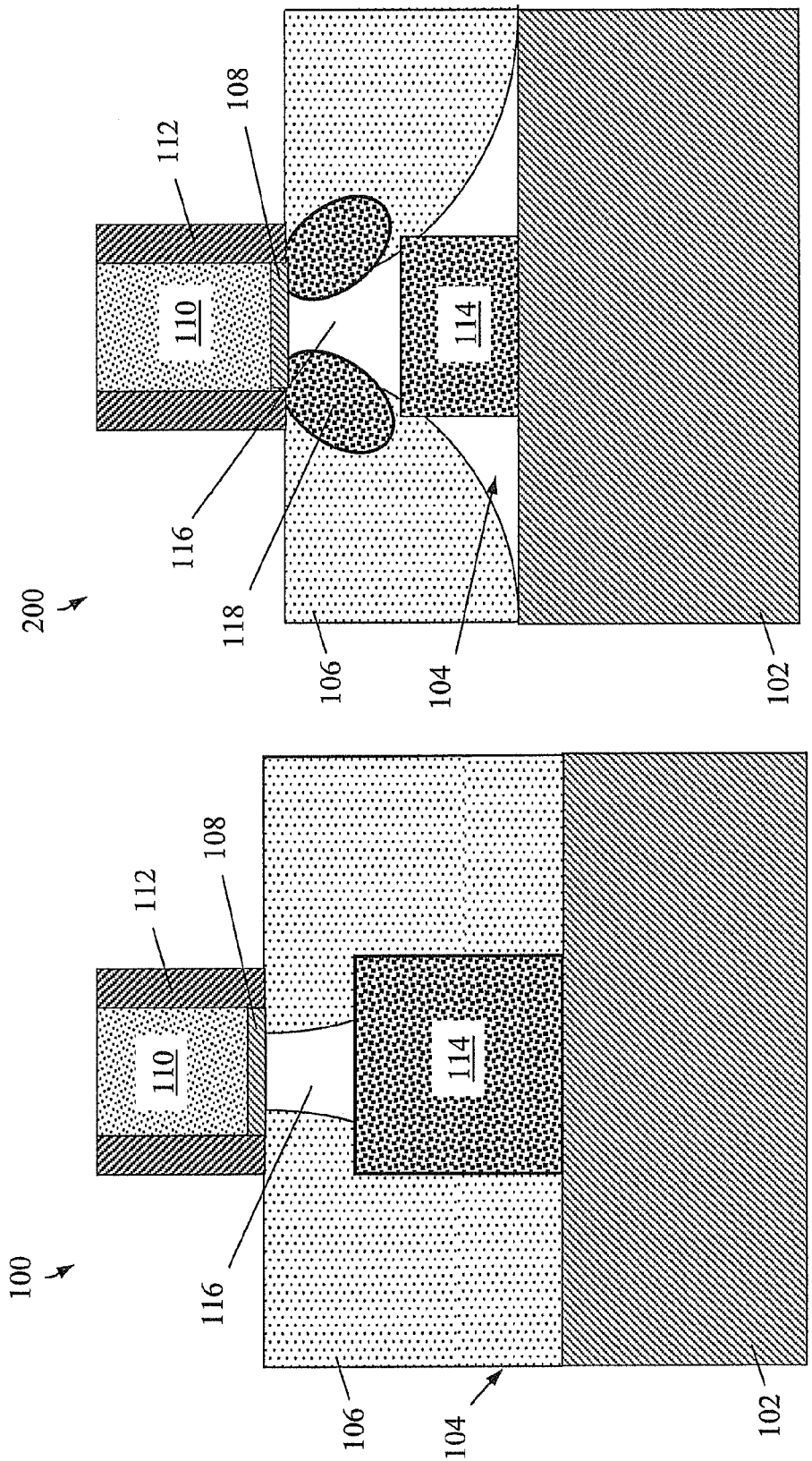

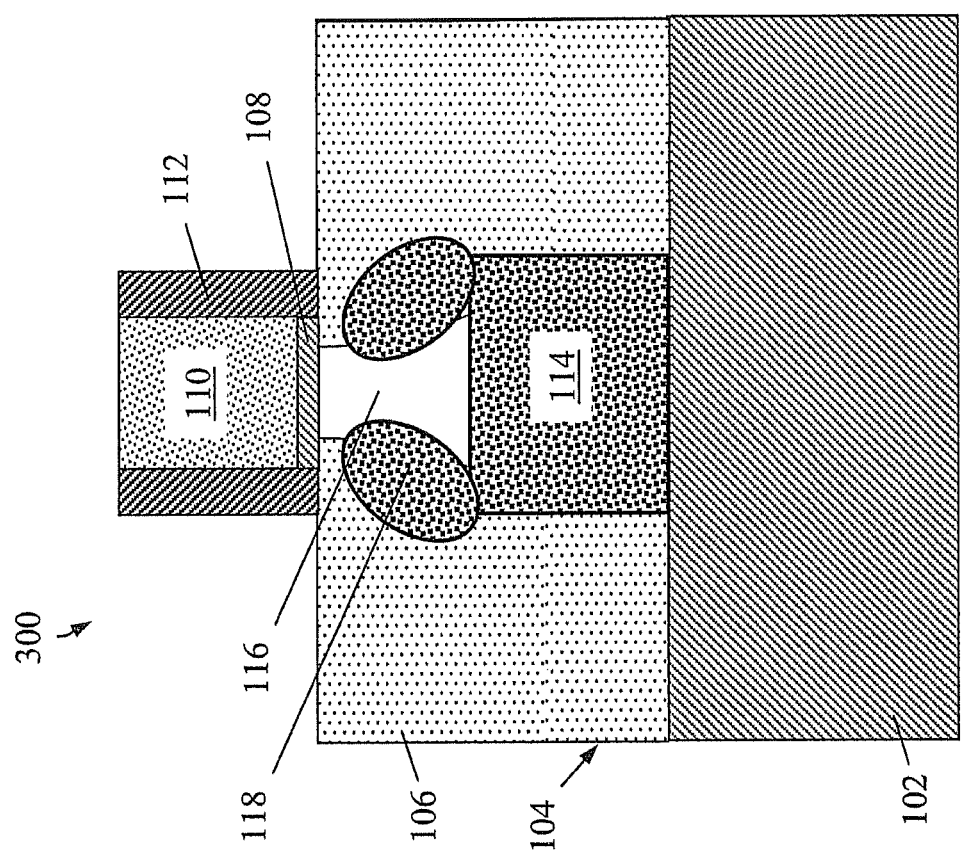

1000

SELF-ALIGNED WELL IMPLANT FOR IMPROVING SHORT CHANNEL EFFECTS CONTROL, PARASITIC CAPACITANCE, AND JUNCTION LEAKAGE

BACKGROUND

The present invention relates generally to semiconductor device manufacturing techniques and, more particularly, to a method of forming a self-aligned well implant in transistor devices for improving short channel effects (SCE) control, parasitic capacitance, and junction leakage.

When the channel length of a transistor is scaled down below about 40 nanometers (nm), high well doping is needed to avoid source/drain punchthrough problems. Typically, this type of well implant procedure is carried out prior to gate patterning. As a result, the heavily doped well region is not only located beneath the channel, it is also present in the source/drain regions. In bulk (e.g., silicon) devices, this heavily doped well structure located under the source/drain region increases both junction capacitance and junction leakage. On the other hand, for partially depleted silicon-on-insulator (SOI) devices, the source/drain junctions cannot butt to the buried oxide due to the presence of the heavy well, and thus junction capacitance and leakage will be increased for these devices also.

One solution to this issue may be to increase the source/drain implant energy and dose to facilitate better butting of the source/drain regions to the buried oxide. However, this is not a very efficient approach for scaled devices due to penetration problems. That is, source/drain implant dopants get into the channel through the gates. Another approach could be to add a source/drain tail implant to a graded source/drain profile. Since this entails a larger energy implant, it is also easy to create an undesired, deep source/drain punchthrough condition.

SUMMARY

In an exemplary embodiment, a method of forming a self-aligned well implant for a transistor device includes forming a patterned gate structure over a substrate, the patterned gate structure including a gate conductor, a gate dielectric layer and sidewall spacers, and the substrate including an undoped semiconductor layer beneath the gate dielectric layer and a doped semiconductor layer beneath the undoped semiconductor layer; removing portions of the undoped semiconductor layer and the doped semiconductor layer left unprotected by the patterned gate structure, wherein a remaining portion of the undoped semiconductor layer beneath the patterned gate structure defines a transistor channel and a remaining portion of the doped semiconductor layer beneath the patterned gate structure defines the self-aligned well implant; and growing a new semiconductor layer at locations corresponding to the removed portions of the undoped semiconductor layer and the doped semiconductor layer, the new semiconductor layer corresponding to source and drain regions of the transistor device.

In another embodiment, a method of forming a self-aligned well implant for a transistor device includes forming an initial patterned gate structure over a substrate, the initial patterned gate structure including a dummy gate conductor, a gate dielectric layer and sidewall spacers; forming source and drain regions in the substrate; selectively removing the dummy gate conductor; performing a dopant implant while protecting the source and drain regions therefrom so as to form the self-aligned well implant; and forming a final patterned gate structure by replacing the removed dummy gate conductor with a permanent gate conductor.

In another embodiment a transistor device includes a patterned gate structure formed over a substrate, the patterned gate structure including a gate conductor, a gate dielectric layer and sidewall spacers; and a doped well implant formed in the substrate, the well implant being self-aligned with the patterned gate structure.

BRIEF DESCRIPTION OF THE SEVERAL VIEWS OF THE DRAWINGS

Referring to the exemplary drawings wherein like elements are numbered alike in the several Figures:

FIG. 1 is a cross sectional view of a transistor device having a self-aligned well implant in accordance with an exemplary embodiment of the invention;

FIG. 2 is a cross sectional view of a transistor device having a self-aligned well implant in accordance with another exemplary embodiment of the invention;

FIG. 3 is a cross sectional view of a transistor device having a self-aligned well implant in accordance with another exemplary embodiment of the invention;

DETAILED DESCRIPTION

Figure 5:
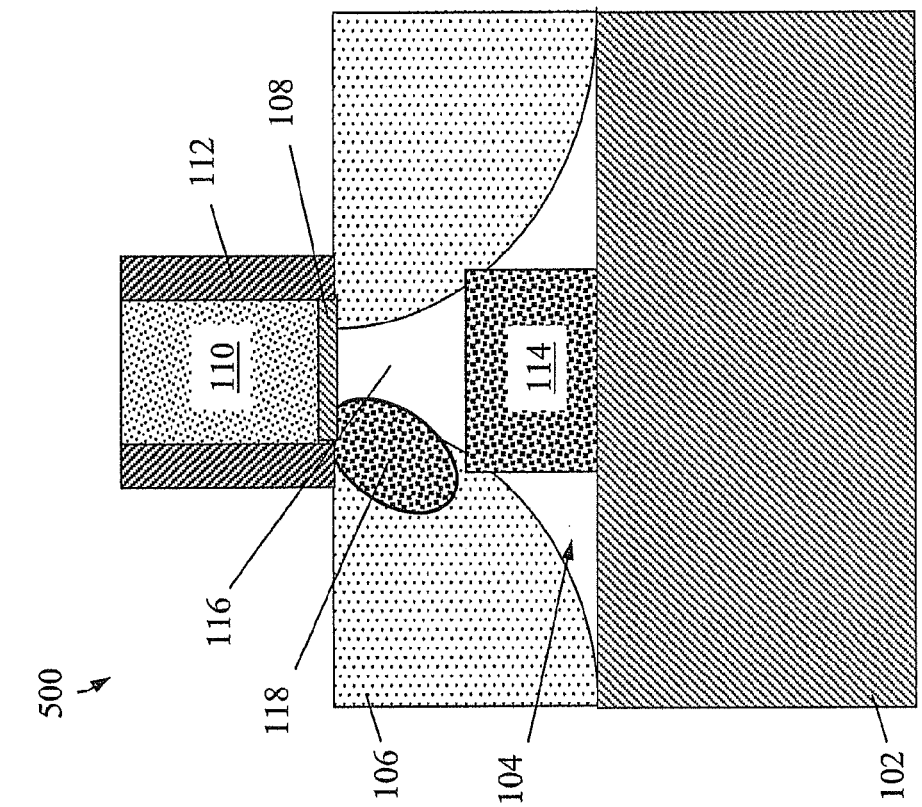
FIG. 5 is a cross sectional view of a transistor device having a self-aligned well implant in accordance with another exemplary embodiment of the invention.

Disclosed herein are methods of forming a self-aligned well implant for transistor devices that improves short channel effects (SCE) control, parasitic capacitance, and junction leakage. In one embodiment, the self-aligned well implant is formed by blanket doping of an entire semiconductor layer (e.g., SOI), followed by gate stack/spacer formation, and subsequent etching of the doped SOI layer not directly beneath the gate/spacer structure. A subsequent epitaxial semiconductor growth then redefines regions for source/drain formation, thus ensuring the well implant resides only below the channel. In another embodiment, a dummy gate structure is selectively removed, followed by doping through the thin gate dielectric layer and beneath the channel. Additional gate fill material is then deposited to form a completed gate structure.

As will be discussed below, several variations of the self-aligned well method are possible. For example, if a self-aligned, super steep retrograde well (SSRW) is used, no halo implant is needed to control SCE and the channel is undoped. Thus, there is much less voltage threshold ($V_t$) variation due to doping variation. Moreover, by not using a halo implant, later strain engineered layers used for carrier mobility enhancement (e.g., epitaxial SiGe, SiC, etc.) will not be adversely affected due to an implant.

With respect to transistor formation on bulk semiconductor devices, a self-aligned, shallow well is applied to avoid source/drain punchthrough and to control SCE without a significant increase junction capacitance, while still having a non self-aligned deep well for device isolation. For partially depleted SOI (PDSOI) devices, well implantation does not traditionally take place prior to gate patterning. Here, the well is only present under the channel and thin spacers of the gate structure, not under the source/drain regions. Thus, by using this structure, source/drain butting will be improved, and junction capacitance and leakage will be reduced.

Referring now to FIG. 1, there is shown a cross sectional view of a transistor device 100 having a self-aligned well implant in accordance with an exemplary embodiment of the invention. In this embodiment, the transistor device is formed using an SOI substrate, of which includes a buried oxide (BOX) layer 102 formed on a bulk substrate (not shown in FIG. 1). Formed upon the SOI layer 102 is an SOI layer 104 that is doped to form source/drain regions 106. It should be appreciated at this point that although the term "SOI" is generally known in the art as silicon-on-insulator, the term can also generally describe a semiconductor-on-insulator layer such as silicon germanium, for example. One skilled in the art will also recognize the gate structures depicted in FIG. 1, including a gate insulator (e.g., oxide, high-k material, etc.) 108, gate conductor 110 (e.g., polysilicon, metal, etc.), and gate sidewall spacers 112 (e.g., nitride, oxide). Where a metal material is used for the gate conductor 110, the work function of the metal may be used to adjust the voltage threshold of the device.

A self-aligned doped well 114 is located beneath the channel 116 and is laterally confined to the distance between the sidewall spacers 112 so as not to extend into the source/drain regions 106. The well 114 is doped at a concentration of $1 \times 10^{19}$ atoms/cm$^3$ or less, depending upon the gate length of the device, and is disposed about 5 to about 15 nm from the surface of the SOI layer 104. Where the transistor device 100 is an NFET, for example, the source/drain regions 106 would comprise an n-type dopant, and the self-aligned well 114 would comprise a heavily concentrated p-type dopant, in contrast to a lightly p-type doped channel region 116. The embodiment of FIG. 1 may be formed by the blanket well doping/etching/epitaxial growth approach outlined above, and discussed in further detail below.

Figure 4:
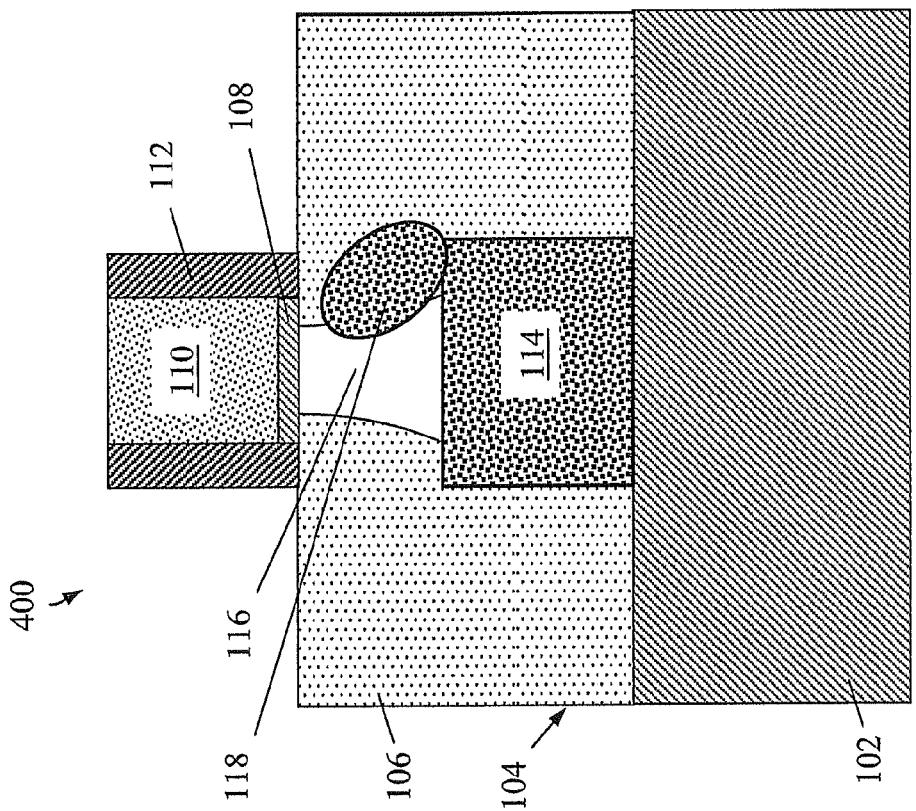
FIG. 4 is a cross sectional view of a transistor device having a self-aligned well implant in accordance with another exemplary embodiment of the invention.

By way of comparison, FIG. 2 is a cross sectional view of a transistor device 200 having a self-aligned well implant in accordance with another exemplary embodiment of the invention. In addition to the structures shown in FIG. 1, the embodiment of FIG. 2 further includes the use of symmetrical halo implants 118 (given that the vertical source/drain profile is not as sharp as the for embodiment of FIG. 1), and can be formed by the dummy gate removal/doping/gate replacement approach also outlined above and discussed in further detail below. On the other hand, halo implants 118 can also be used with the blanket well doping/etching/epitaxial growth approach so as to form the device 300 shown in FIG. 3.

Where used, the halo implants may also be asymmetrical (i.e., formed on only the source side or only the drain side of the transistor as desired). FIG. 4 illustrates a device 400 having an asymmetrical halo implant using the first formation (blanket well doping/etching/regrowth) technique, while FIG. 5 illustrates a device 500 having an asymmetrical halo implant using the second formation (dummy gate removal/doping/gate replacement) technique.

Figure 7:
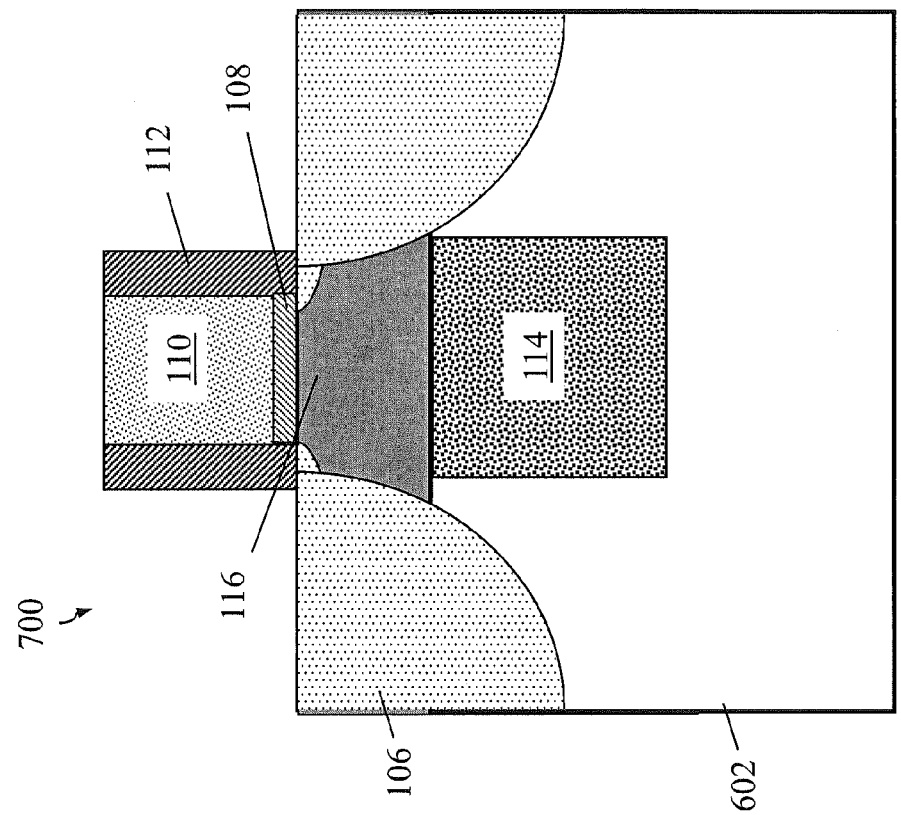
FIG. 7 is a cross sectional view of a transistor device having a self-aligned well implant in accordance with another exemplary embodiment of the invention.
Figure 6:
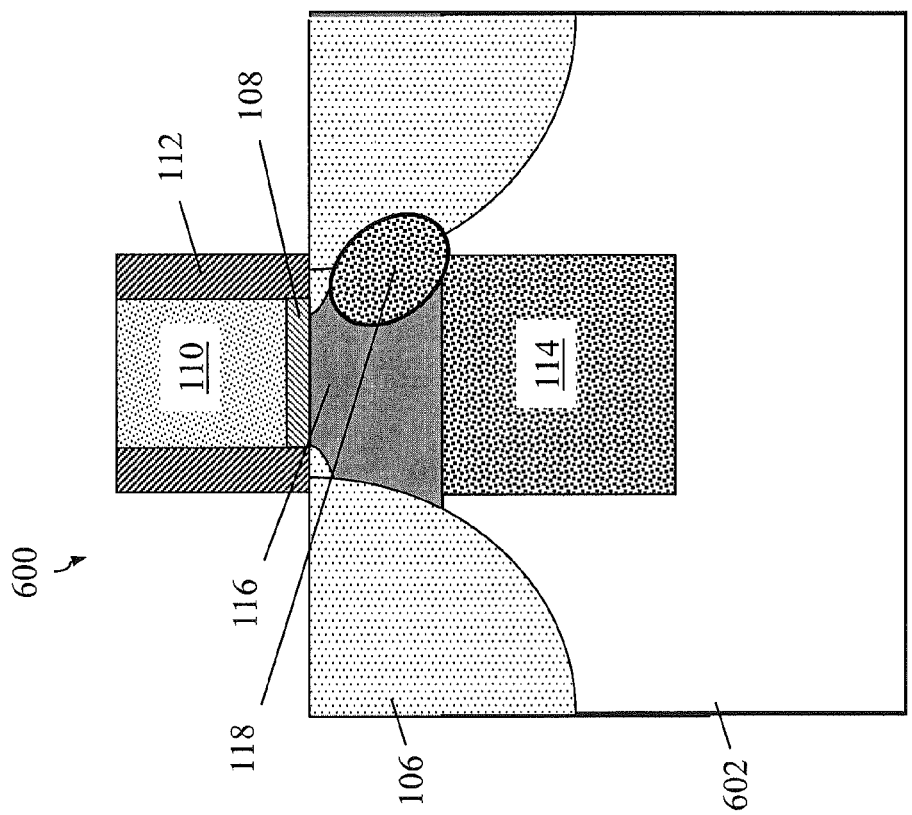
FIG. 6 is a cross sectional view of a transistor device having a self-aligned well implant in accordance with another exemplary embodiment of the invention.

As indicated above, the self-aligned well implant techniques are, in addition to SOI substrates, equally applicable to bulk substrate devices. For example, the transistor device 600 in FIG. 6 depicts a self-aligned well 114 formed in a bulk substrate 602 wherein an asymmetrical halo implant 118 is also present. In contrast, FIG. 7 illustrates a transistor device 700 with a self-aligned well 114 formed in a bulk substrate 602 wherein no halo implants are utilized.

Figure 8A:
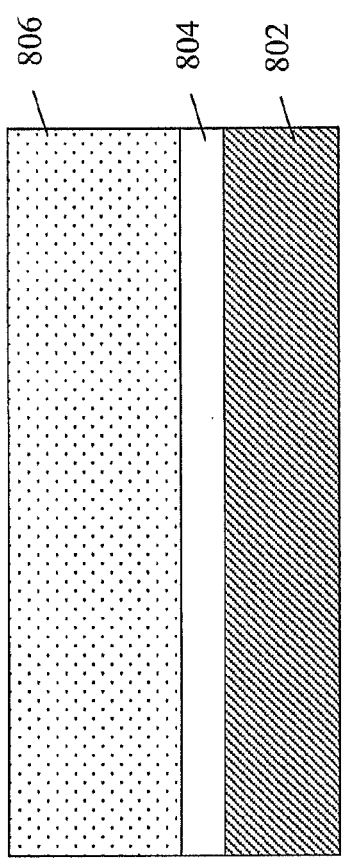
FIGS. 8(a) through 8(g) are a series of cross sectional views illustrating a method of forming a self-aligned well implant for transistor devices, in accordance with an embodiment of the invention.
Figure 8B:
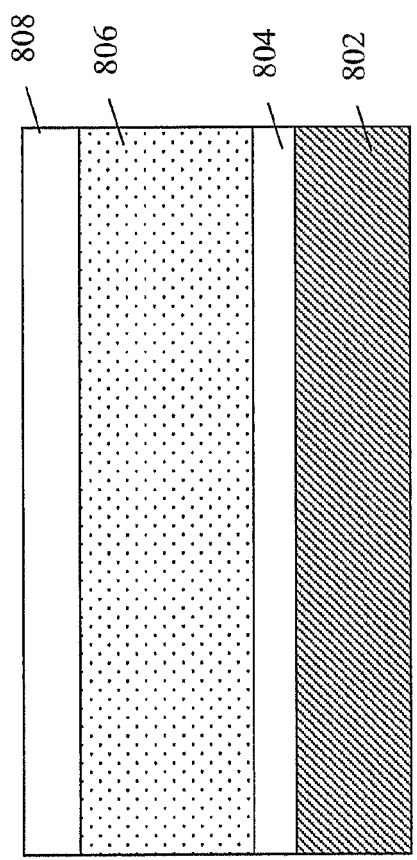

Referring now to FIGS. 8(a) through 8(g), there is shown a series of cross sectional views illustrating a method of forming a self-aligned well implant for transistor devices, in accordance with an embodiment of the invention. In this sequence, the exemplary blanket well doping/etching/epitaxial growth technique is featured. Although the starting substrate may be a bulk substrate or an SOI substrate, the example depicted in FIG. 8(a) shows a portion of an SOI substrate, including a buried oxide (BOX) layer 802 (e.g., SiO$_2$) formed upon a bulk layer (not shown), a lightly doped SOI layer 804 (e.g., silicon) formed upon the BOX layer 802, and a doped SOI layer 806 over the lightly doped SOI layer. However, where the starting substrate is a bulk substrate, then a lightly doped well implant may be used to provide device isolation.

In the specific example depicted, a PFET device is illustrated, and thus the doped SOI layer 806 is an n-type layer (e.g., arsenic, antimony) having a concentration of $1 \times 10^{19}$ atoms/cm$^3$ or less. For an NFET device, the doped SOI layer 806 is a p-type layer (e.g., boron) having a concentration of about $1 \times 10^{19}$ atoms/cm$^3$ or less. One way to produce the doped SOI layer 806 is to subject an SOI layer having a total thickness corresponding to the layers 804/806 to an implant process. Alternatively, the doped SOI layer 806 can be grown on the lightly doped SOI layer 804. In either case, FIG. 8(b) then shows the formation of an un-doped silicon layer 808 that is epitaxially grown on the doped SOI layer 806, at an exemplary thickness of about 5-15 nm. This results in a sharp dopant profile with respect to the interface between layers 806 and 808.

Figure 8C:
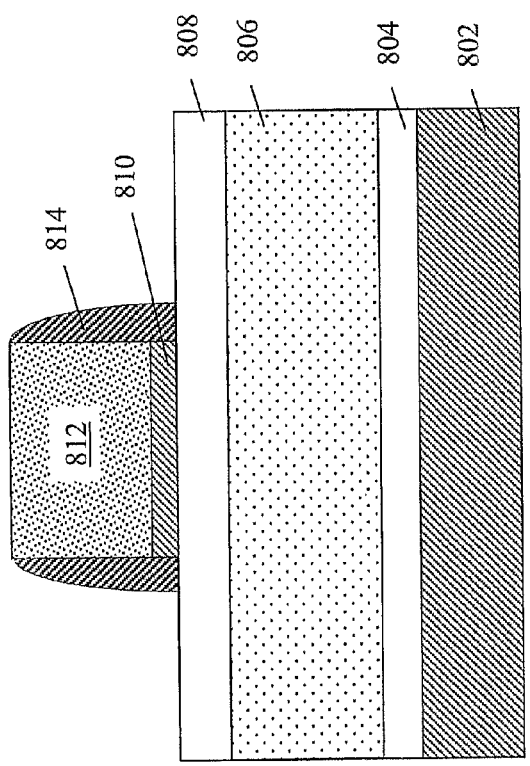
Figure 8D:
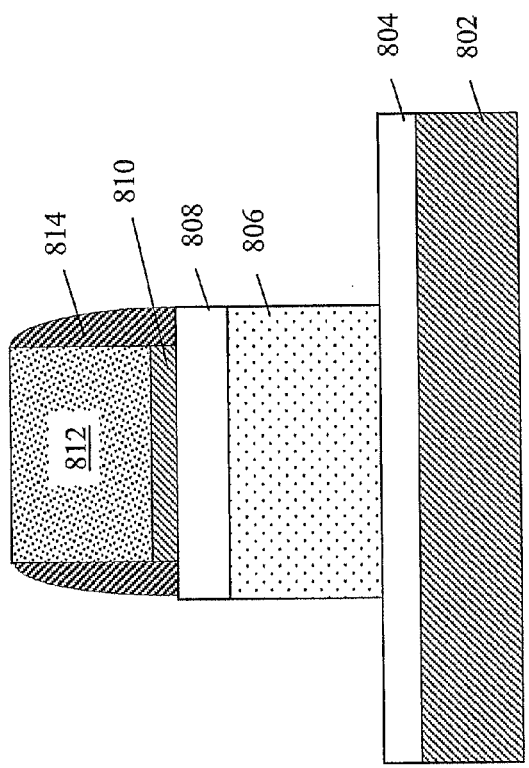

Then, as shown in FIG. 8(c), a gate dielectric layer 810 (e.g., oxide, high-k material, etc.), gate conductor 812 (e.g., polysilicon, metal, etc.) and gate sidewall spacers 814 (e.g., nitride, oxide) are formed as known in the art, followed by etching of the exposed portions of the un-doped silicon layer 808, and the doped SOI layer 806, stopping on the lightly doped SOI layer 804 as shown in FIG. 8(d). The remaining portion of the un-doped silicon layer 808 corresponds to the channel region, while the remaining portion of the doped SOI layer 806 corresponds to the self-aligned well.

Figure 8E:
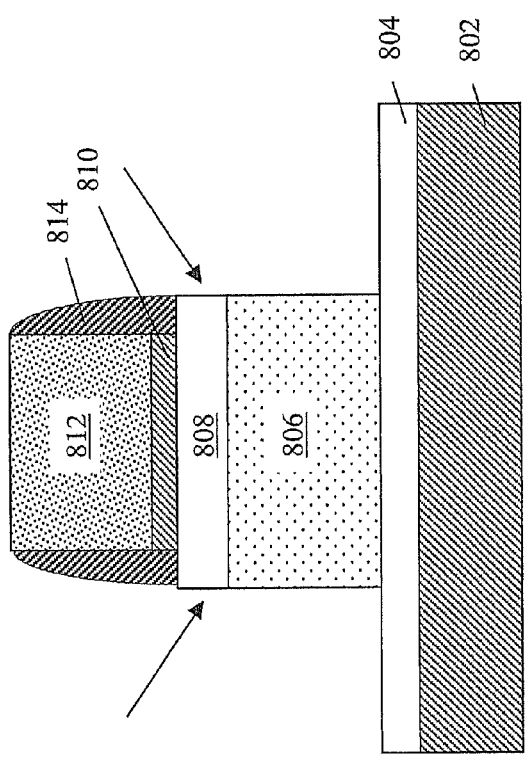
Figure 8F:
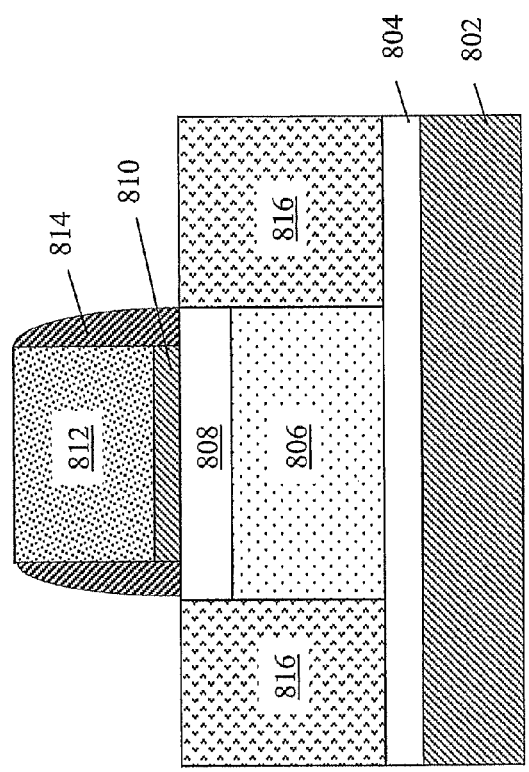
Figure 8G:
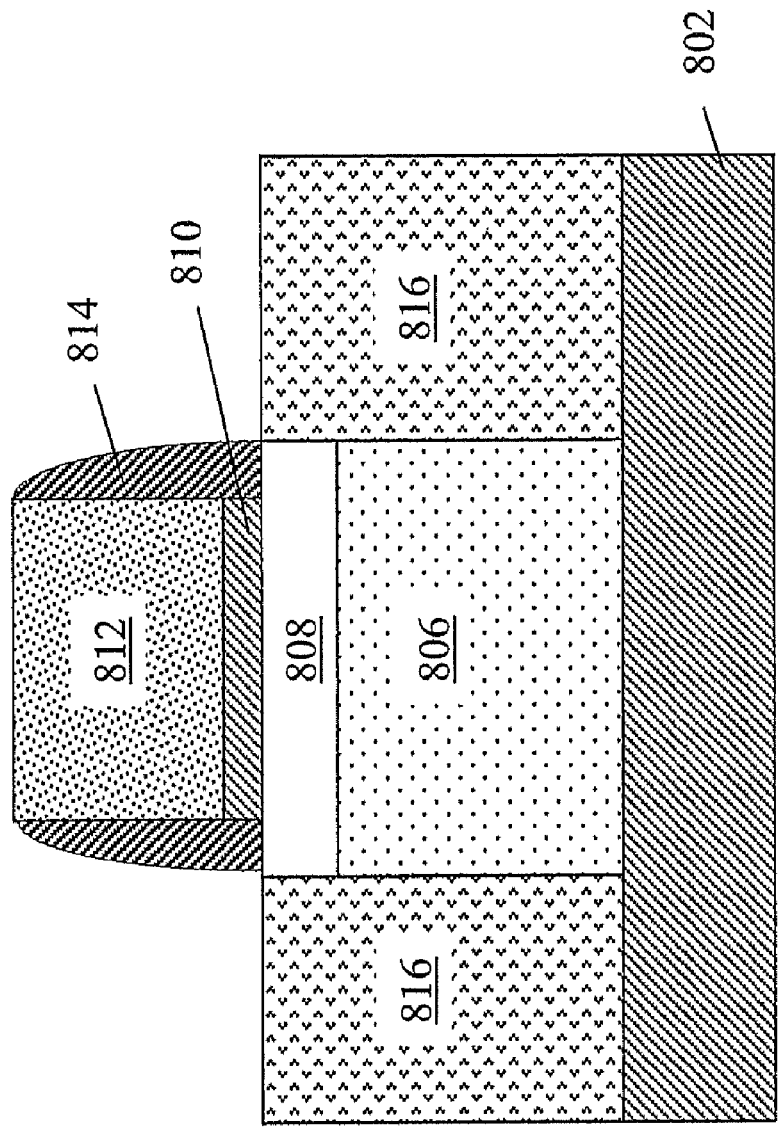

Any source/drain extension implants may then be performed at this stage, as represented by the arrows in FIG. 8(e). A rapid thermal anneal (RTA) step is also optional at this time. Then, in FIG. 8(f), source and drain regions 816 are epitaxially grown on the lightly doped SOI layer 804. For the PFET example, the grown material may be in-situ boron doped silicon germanium (SiGe), for example, and for an NFET example, the grown material may be in-situ phosphorous doped silicon carbon (Si:C). Again, an RTA and/or laser spiked anneal (LSA) is optional at this point and can be skipped where performed after the extension implant. During RTA, it will be noted that any areas of relatively heavy dopant concentration (e.g., well 806, source/drain regions 816 would diffuse into the lightly doped SOI layer 804, increase the dopant concentration at the back SiO$_2$/Si interface, and the source/drain junctions reach the backside of Si/SiO$_2$ interface, as depicted in FIG. 8(g).

Figure 9A:
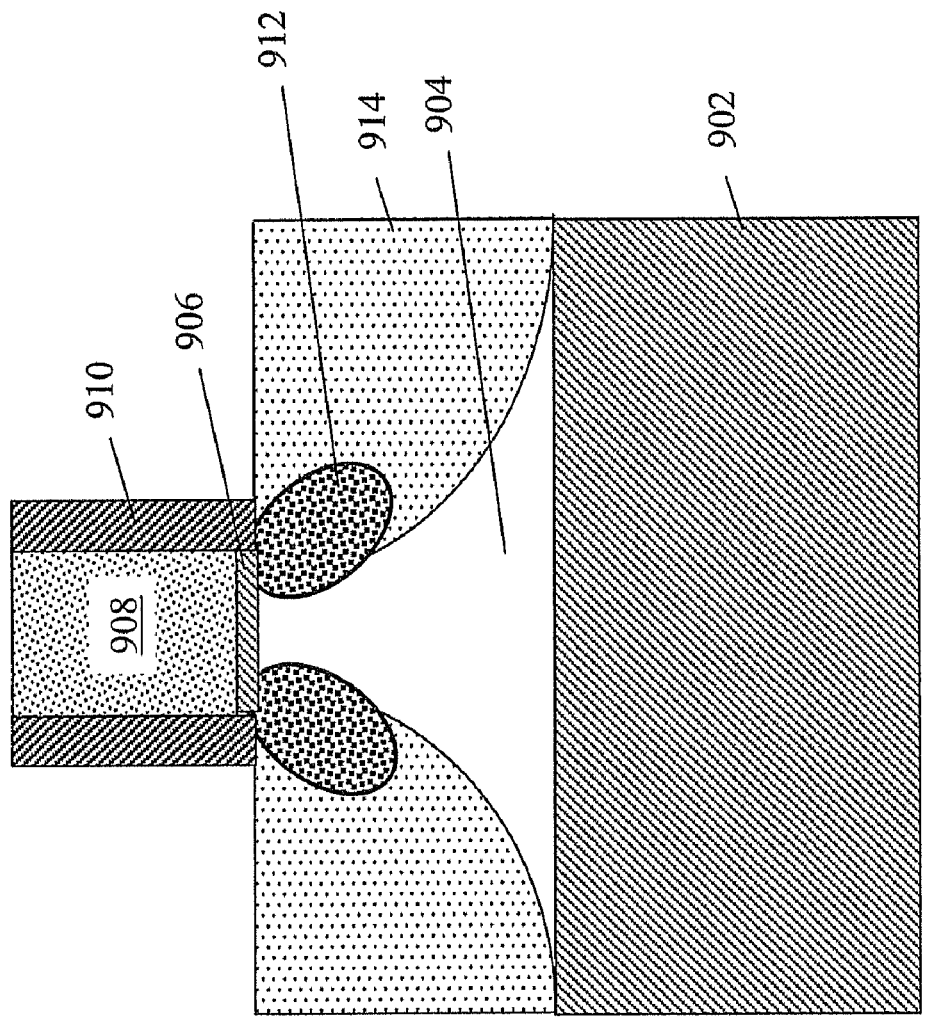
FIGS. 9(a) through 9(e) are a series of cross sectional views illustrating a method of forming a self-aligned well implant for transistor devices, in accordance with another embodiment of the invention.
Figure 9B:
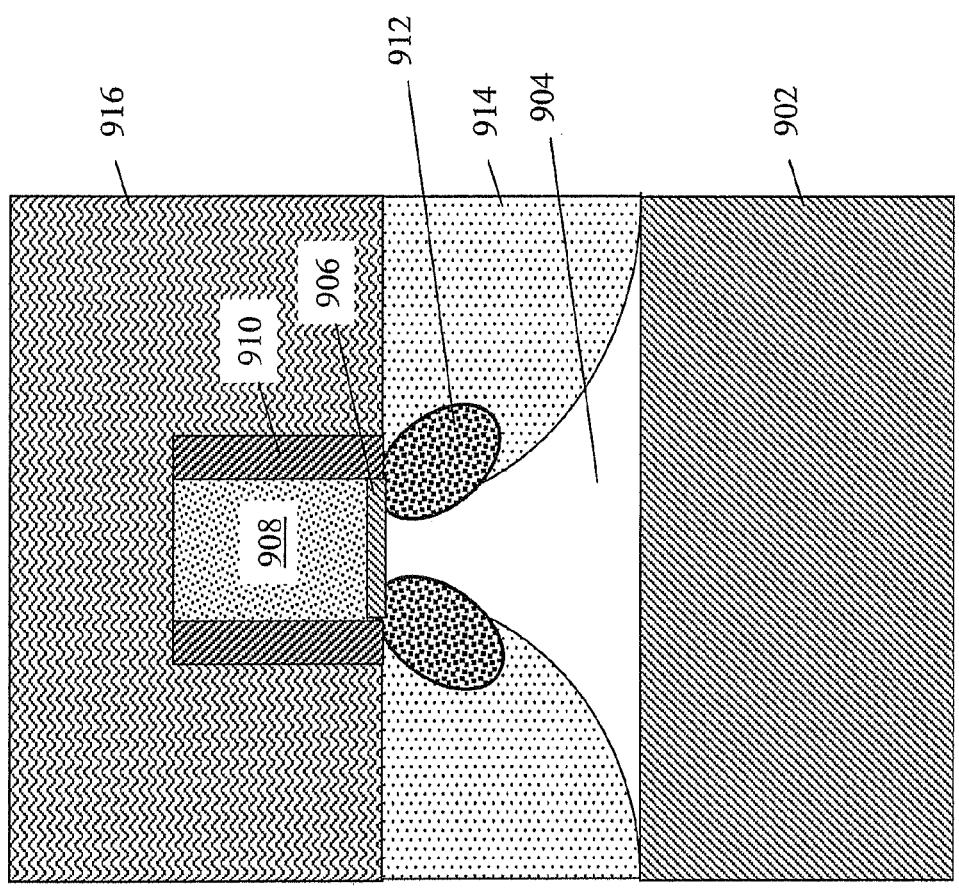

Referring next to FIGS. 9(a) through 9(e), there is shown a series of cross sectional views illustrating a method of forming a self-aligned well implant for transistor devices, in accordance with another embodiment of the invention. In this sequence, the exemplary dummy gate removal/doping/gate replacement technique is featured. Although the starting substrate may be a bulk substrate or an SOI substrate, the example depicted in FIG. 9(a) shows a portion of an SOI substrate, including a buried oxide (BOX) layer 902 (e.g., SiO$_2$) formed upon a bulk layer (not shown) and a lightly doped SOI layer 904 (e.g., silicon) formed upon the BOX layer 902. Again, for a partially depleted SOI device, there is no lightly doped well implant for device isolation. However, where the starting substrate is a bulk substrate, then a lightly doped well implant may be used to provide device isolation.

Figure 9C:
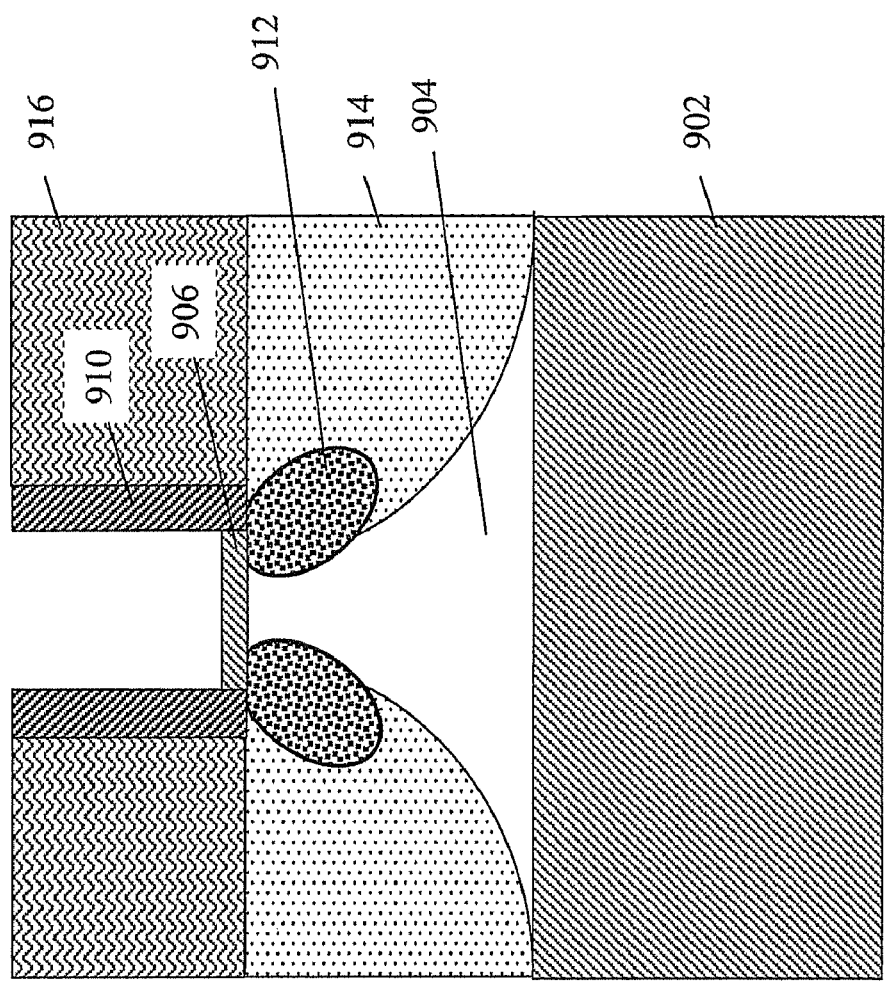

As further shown in FIG. 9(a), a gate dielectric layer 906 (e.g., high-k material, oxide), dummy gate conductor 908 (e.g., metal, polysilicon, etc,) and gate sidewall spacers 910 (e.g., nitride, oxide) are formed as known in the art. Here, optional halo implants 912 (symmetrical or asymmetrical) are also shown, in addition to the source/drain implants 914. Then, in FIG. 9(b), an interlevel dielectric layer 916 (e.g., low-K, $SiO_2$, etc.) is formed, planarized, and then patterned and opened to expose the dummy gate conductor 908, which is then removed through RIE, for example, as shown in FIG. 9(c).

Figure 9D:
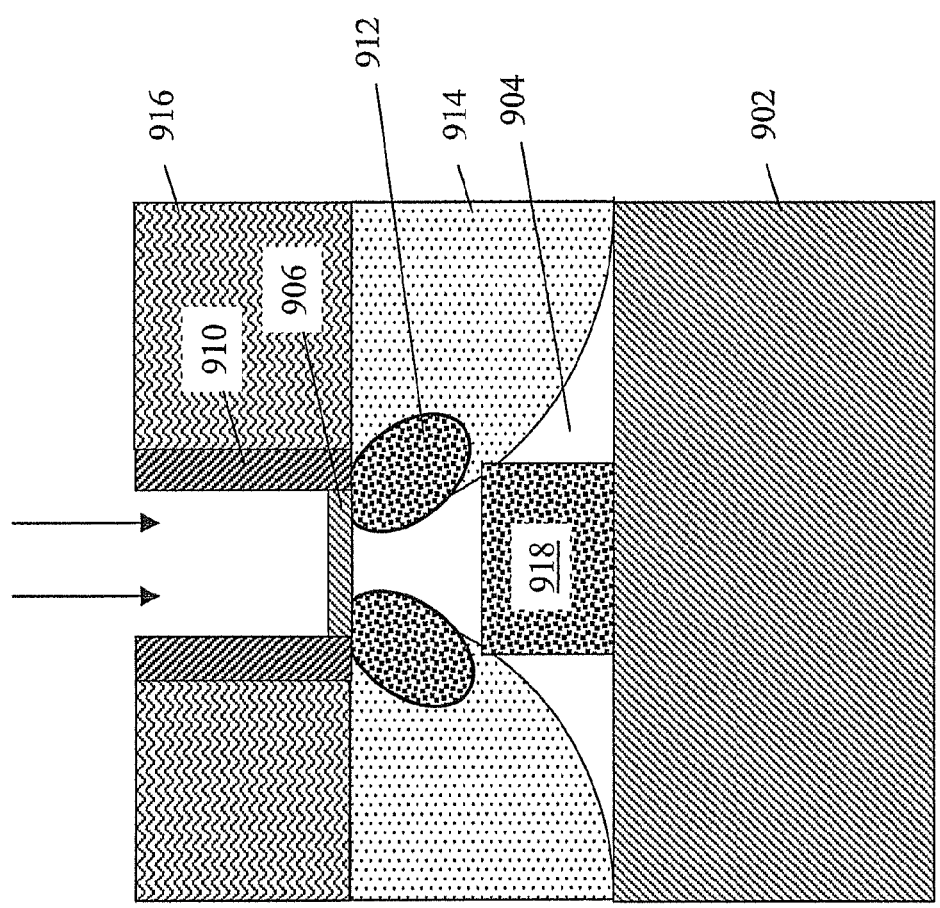
Figure 9E:
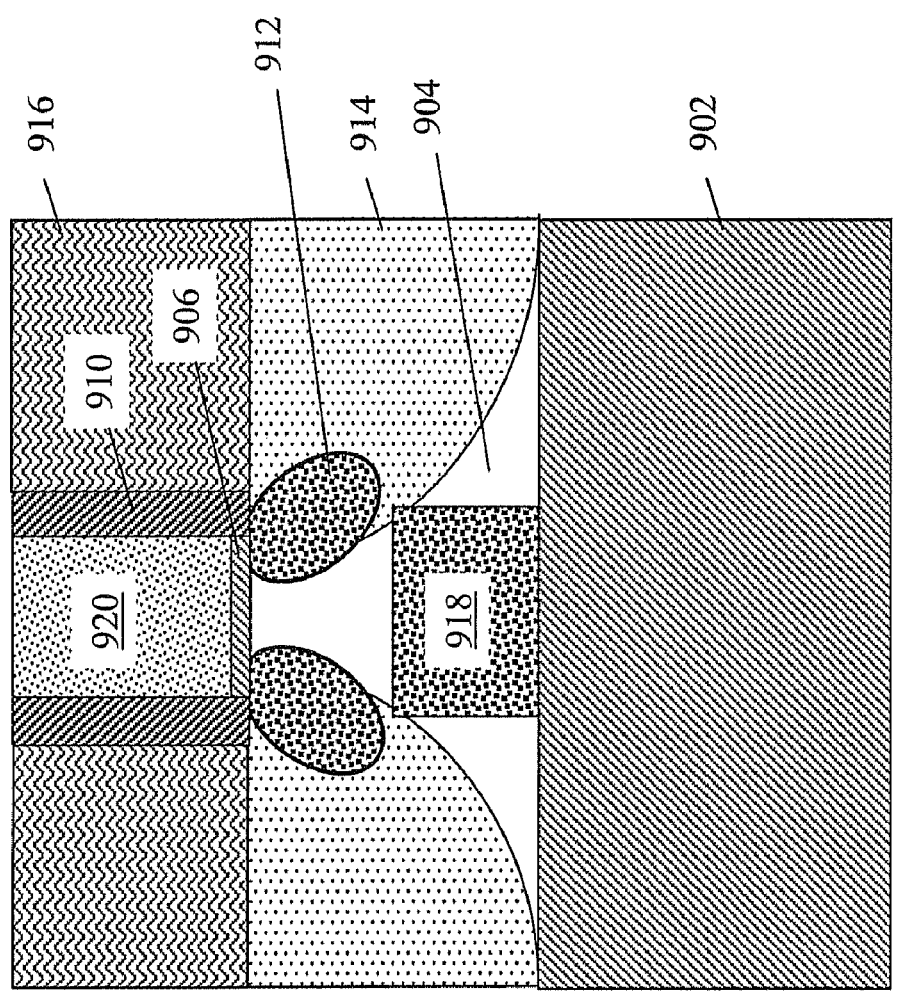

In FIG. 9(d), the device is subjected to a self-aligned well dopant implant (represented by the arrows) and RTA so as to define the self-aligned well 918. Finally, in FIG. 9(e), another gate fill process is used to replace the removed dummy gate conductor with a permanent gate conductor 920, after which normal device processing may continue.

In lieu of traditional halo implants, which occur before source/drain implantation, the dummy gate self-aligned technique can also be used in conjunction with asymmetric halo and/or extension implants. In a generic chip design, there may be FETs having opposite layout orientations with respect to one another. For example, some FETs may have a source-gate-drain orientation (also referred to as "source-up" or "source-left") while other FETs may have a drain-gate-source orientation (also referred to as "source-down" or "source-right"). Thus, any asymmetric implant scheme must independently implant, for example, source-up and source-down oriented devices, and the main difficulty in this regard is the lithographic challenges associated with patterning at very tight pitches on non-planar surfaces, as depicted by the structure 1000 in FIG. 10. For one, resist scumming of the gate limits the process window. In addition, implant shadowing by the resist limits the implant angle/energy.

Figure 11:
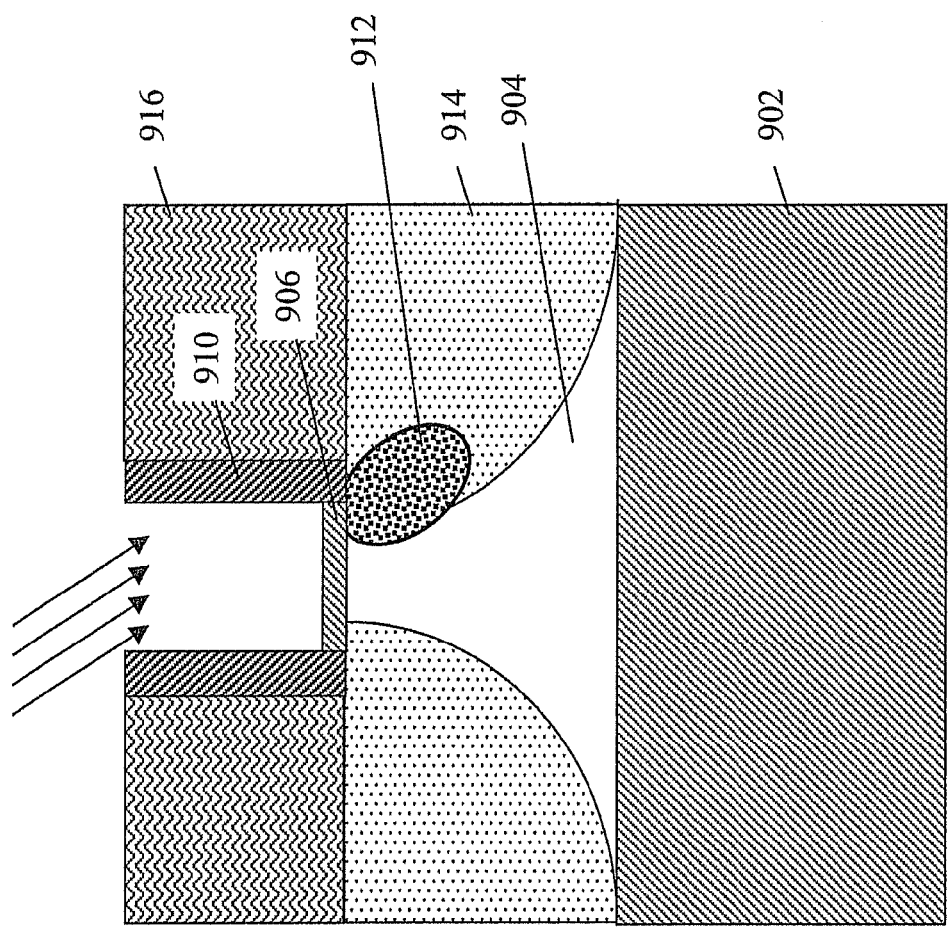

The disclosed structure/process completely eliminates the resist scumming concerns, as there is no topography at the time of lithography. Moreover, the resist shadowing is also improved because the source/drain regions 914 of the device are protected by the ILD dielectric 916 (FIG. 11). As such, the other asymmetric FETs may be protected from multiple implants by using just enough resist to fill the openings left by dummy gate removal.

Figure 10:
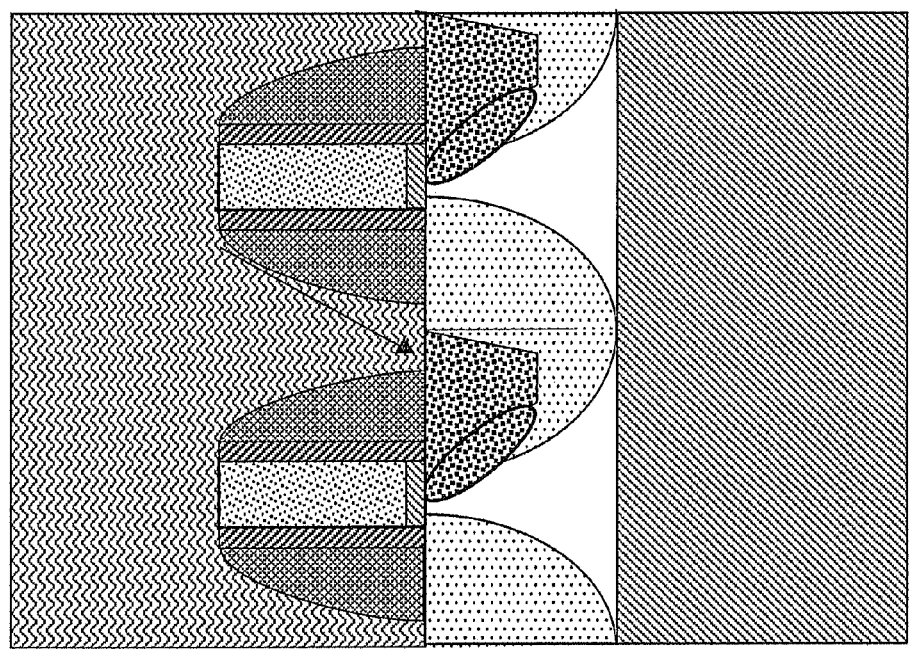
FIGS. 10 and 11 are cross sectional view illustrating dummy gate self-aligned well technique in conjunction with asymmetric halo and/or extension implants, in accordance with another embodiment of the invention.

As will also be noted from the structure 1000 in FIG. 10, the halo implant species differs from the earlier embodiments, and counterdopes the source/drain regions to a certain extent. Here, some improvement in external resistance may be expected, and in the case of a PFET device, less halo implant damage in the eSiGe, which in turns provides more robustness against eSiGe strain relaxation.

It will thus be appreciated that a "gate last" process with respect to implant formation offers certain additional advantages such as, for example, overcoming the gate/pitch dependency on implant angle. More specifically, it is actually the photoresist shadowing rather than the gate shadowing which limits the implant angle allowed. In any case, this dependency would otherwise ultimately determine the degree of asymmetry which can be achieved for a transistor device. In addition, the gate last process places any additional doping only where it is desired (e.g., a halo implant on the drain side of the channel region only, an extension implant on source side of the channel region only).

In summary, for asymmetric halo implants using the dummy gate self-aligned technique, an exemplary source side implant process may include: lithography to open the source-up NFET gates, followed by removal (etch) of the source-up NFET gate conductor material; and stripping of photoresist and implanting a source-up NFET asymmetric halo (and/or extension). This sequence is then repeated for source-down NFETs. Once all NFET source implants are completed, the gate conductor material is replaced, such as through deposition and polishing. The overall process may then be repeated for the PFETs.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a self-aligned well implant for a transistor device, the method comprising:

forming a patterned gate structure over a substrate, the patterned gate structure including a gate conductor, a gate dielectric layer and sidewall spacers, and the substrate including an undoped semiconductor layer beneath the gate dielectric layer and a doped semiconductor layer beneath the undoped semiconductor layer; and with the patterned gate structure in place, removing, by etching, portions of the undoped semiconductor layer and the doped semiconductor layer left unprotected by the patterned gate structure, wherein a remaining portion of the undoped semiconductor layer beneath the patterned gate structure defines a transistor channel and a remaining portion of the doped semiconductor layer beneath the patterned gate structure defines the self-aligned well implant, and growing a new semiconductor layer at locations corresponding to the removed portions of the undoped semiconductor layer and the doped semiconductor layer, the new semiconductor layer corresponding to source and drain regions of the transistor device.

2. The method of claim 1, further comprising forming the doped semiconductor layer by implanting a dopant material of a first polarity type into an upper portion of a silicon-on-insulator (SOI) layer such that a lower portion of the SOI layer is doped at a lighter concentration with respect to the upper portion.

3. The method of claim 2, wherein the dopant material of the first polarity type is one of arsenic and antimony, at a concentration of about $1\times10^{19}$ atoms/cm$^3$ or less.

4. The method of claim 2, wherein the dopant material of the first polarity type is boron, at a concentration of about $1\times10^{19}$ atoms/cm$^3$ or less.

5. The method of claim 2, further comprising forming the undoped semiconductor layer by epitaxial growth on the doped semiconductor layer.

6. The method of claim 1, wherein the new semiconductor layer comprises an epitaxially grown silicon germanium layer.

* * * * *